US011688672B2

(12) United States Patent
Khanolkar et al.

(10) Patent No.: US 11,688,672 B2
(45) Date of Patent: Jun. 27, 2023

(54) LEADFRAME CAPACITORS

(71) Applicant: Texas Instruments Incorporated, Dallas, TX (US)

(72) Inventors: Vijaylaxmi Khanolkar, Pune (IN); Sreeram Subramanyam Nasum, Bangalore (IN); Tarunvir Singh, Punjab (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/527,994

(22) Filed: Nov. 16, 2021

(65) Prior Publication Data

US 2022/0077038 A1 Mar. 10, 2022

Related U.S. Application Data

(62) Division of application No. 16/901,310, filed on Jun. 15, 2020, now Pat. No. 11,205,611.

(51) Int. Cl.
*H01L 23/49* (2006.01)
*H01L 23/495* (2006.01)
*H01L 23/00* (2006.01)
*H01L 21/56* (2006.01)
*H01L 23/492* (2006.01)

(52) U.S. Cl.
CPC ...... *H01L 23/49589* (2013.01); *H01L 21/565* (2013.01); *H01L 23/492* (2013.01); *H01L 23/49541* (2013.01); *H01L 23/49575* (2013.01); *H01L 24/46* (2013.01); *H01L 24/85* (2013.01)

(58) Field of Classification Search
CPC ............. H01L 23/49589; H01L 23/492; H01L 23/49541; H01L 23/49575; H01L 23/49; H01L 24/46; H01L 24/85; H01L 21/565
USPC .......................................... 257/532; 438/957
See application file for complete search history.

(56) References Cited

U.S. PATENT DOCUMENTS

| | | | |
|---|---|---|---|
| 4,714,952 A | 12/1987 | Takekawa et al. | |
| 5,444,600 A | 8/1995 | Dobkin et al. | |
| 9,165,873 B1 | 10/2015 | Howard et al. | |
| 2014/0253227 A1 | 9/2014 | Yach et al. | |
| 2015/0069572 A1 | 3/2015 | Khanolkar et al. | |
| 2015/0325501 A1* | 11/2015 | Sutton ............... | H01L 23/49503 257/676 |

(Continued)

OTHER PUBLICATIONS

PCT International Search Report dated Sep. 23, 2021.
(Continued)

*Primary Examiner* — Didarul A Mazumder
(74) *Attorney, Agent, or Firm* — Ronald O. Neerings; Frank D. Cimino

(57) ABSTRACT

An electronic device having a package structure with conductive leads, first and second dies in the package structure, as well as first and second conductive plates electrically coupled to the respective first and second dies and having respective first and second sides spaced apart from and directly facing one another with a portion of the package structure extending between the first side of the first conductive plate and the second side of the second conductive plate to form a capacitor. No other side of the first conductive plate directly faces a side of the second conductive plate, and no other side of the second conductive plate directly faces a side of the first conductive plate.

24 Claims, 10 Drawing Sheets

(56) References Cited

U.S. PATENT DOCUMENTS

| | | |
|---|---|---|
| 2016/0284631 A1 | 9/2016 | Cabahug et al. |
| 2017/0178787 A1 | 6/2017 | Massolini et al. |
| 2017/0194088 A1 | 7/2017 | Massolini et al. |
| 2017/0201399 A1 | 7/2017 | Adinarayana et al. |
| 2017/0287885 A1* | 10/2017 | Murtuza ................. H01L 24/85 |
| 2018/0226920 A1 | 8/2018 | Mukherjee et al. |
| 2019/0067171 A1* | 2/2019 | Estacio ............. H01L 23/49575 |
| 2019/0362890 A1 | 11/2019 | Nasum et al. |
| 2020/0044605 A1 | 2/2020 | Mukherjee et al. |
| 2020/0105458 A1 | 4/2020 | Massolini et al. |
| 2020/0168534 A1 | 5/2020 | Bonifield et al. |
| 2020/0185336 A1 | 6/2020 | Nasum et al. |

OTHER PUBLICATIONS

"HCPL-817, Phototransistor Optocoupler High Density Mounting Type" Data Sheet, Avago Technologies, Nov. 5, 2009, 8 pages.
"ACPL-061L, ACPL-064L, ACPL-M61Lm ACPL-W61L, ACPL-K64L, Ultra Low Power 10 MBd Digital CMOS Optocouplers" Data Sheet, Avago Technologies, downloaded from Elcodis.com electronic components distributer on Jun. 15, 2020, 17 pages.

\* cited by examiner

LEADFRAME CAPACITORS

This application is a Divisional of application Ser. No. 16/901,360 filed Jun. 15, 2020.

BACKGROUND INFORMATION

Signal isolation is used in various applications where signaling must cross an isolation barrier, for example, between circuits of different voltage domains. Integrating isolation components into fabricated semiconductor dies uses silicon dioxide as the dielectric material for a capacitive isolation barrier with galvanic isolation, and this integration adds cost and complexity to the manufacturing process. Capacitors are formed within silicon metal layers during silicon wafer fabrication process and the capacitor structure depends on the specific fabrication process node geometry and design rules. In addition, a device design often can only be manufactured using a subset of process nodes with qualified isolation components at a given fabrication facility. Isolation qualification and certification is needed for structures fabricated with each of the specified process nodes, resulting in high cost. Integrated isolation components often require special development by process teams and often employ special design rules. Some applications may use wafer fabrication processes optimized for specific needs like high power and/or high voltage, but these processes may not be compatible with robust isolation dielectric requirements. A new design often cannot utilize processes optimized for specific needs such as power and high voltage without redesign of isolation components for those fabrication process nodes, followed by isolation requalification and certification. Moreover, integrating isolation components in a semiconductor wafer fabrication can lead to relatively large minimum die size for an isolation die.

BRIEF DESCRIPTION

In one aspect, an electronic device includes isolation structures created using a patterned lead frame during IC manufacturing to provide a low cost compact isolation solution that does not impact semiconductor wafer fabrication processes and does not require extra board level components. In one example, an electronic device includes a package structure with conductive leads, first and second dies in the package structure, as well as first and second conductive plates electrically coupled to the respective first and second dies and having respective first and second sides spaced apart from and directly facing one another with a portion of the package structure extending between the first side of the first conductive plate and the second side of the second conductive plate to form a capacitor. No other side of the first conductive plate directly faces a side of the second conductive plate, and no other side of the second conductive plate directly faces a side of the first conductive plate.

In one example, the first side of the first conductive plate extends in a first plane, the second side of the second conductive plate extends in a second plane, and the first and second planes are parallel to one another. In one example, the first and second conductive plates are coplanar in a third plane that is perpendicular to the first and second planes. In one implementation, the package structure has first and second opposite sides spaced apart from one another along a first direction, and the conductive leads are spaced apart from one another along a perpendicular second direction, where the second side of the second conductive plate is spaced apart from the first side of the first conductive plate along one of the first and second directions.

In another example, the second side of the second conductive plate is spaced apart from the first side of the first conductive plate along a third direction that is perpendicular to the first and second directions. In one implementation, the first conductive plate has a first portion having the first side, and a second portion; and the first and second portions of the first conductive plate are non-coplanar. In one example, moreover, the second conductive plate has a first portion having the second side, and a second portion; and the first and second portions of the second conductive plate are non-coplanar. In another example, the electronic device further includes an embedded dielectric insert in the package structure, and the first or second conductive plate is on or in the embedded dielectric insert. In one implementation, multiple conductive plates are on or in the embedded dielectric insert.

Another aspect relates to a method that includes positioning a lead frame, performing connection and molding processes, and a separation process. The lead frame is positioned such that a first side of a first conductive plate is spaced apart from and directly facing a second side of a second conductive plate, where no other side of the first conductive plate directly faces a side of the second conductive plate, and no other side of the second conductive plate directly faces a side of the first conductive plate. The connection process in one example electrically connects a first bond wire to a first die and to the first conductive plate, and electrically connects a second bond wire to a second die and to the second conductive plate. The molding process forms a package structure which encloses the first and second dies, the first and second bond wires and portions of the first and second conductive plates. The separation process separates the first conductive plate, the second conductive plate, and conductive leads from a remaining portion of the lead frame.

In one example, positioning the lead frame includes positioning a first lead frame relative to a second lead frame or relative to a dielectric insert such that the first side of the first conductive plate of the first lead frame is spaced apart from and directly facing the second side of the second conductive plate of the second lead frame or of the dielectric insert. In one implementation, positioning the lead frame includes positioning the first lead frame relative to the dielectric insert such that the first side of the first conductive plate of the first lead frame is spaced apart from and directly facing the second side of the second conductive plate of the dielectric insert. This implementation also includes positioning the second lead frame relative to the dielectric insert such that a first side of a third conductive plate of the second lead frame is spaced apart from and directly facing a second side of a fourth conductive plate of the dielectric insert, where no other side of the third conductive plate directly faces a side of the fourth conductive plate, and no other side of the fourth conductive plate directly faces a side of the third conductive plate.

Another aspect relates to a system having first and second electronic circuits or different voltage domains, as well as an isolation device coupled with the first and second electronic circuits. The isolation device includes a package structure with conductive leads, first and second dies in the package structure, as well as first and second conductive plates electrically coupled to the respective first and second dies and having respective first and second sides spaced apart from and directly facing one another with a portion of the package structure extending between the first side of the first conductive plate and the second side of the second conductive plate to form a capacitor. No other side of the first conductive plate directly faces a side of the second conductive plate, and no other side of the second conductive plate directly faces a side of the first conductive plate.

In one example, the first side of the first conductive plate extends in a first plane; the second side of the second conductive plate extends in a second plane, the first and second planes are parallel to one another, and the first conductive plate and the second conductive plate are coplanar in a third plane that is perpendicular to the first and second planes.

In another example, the first conductive plate has a first portion having the first side and a second portion, and the first and second portions of the first conductive plate are non-coplanar.

In another example, the isolation device includes an embedded dielectric insert in the package structure, wherein one of the first conductive plate and the second conductive plate is on or in the embedded dielectric insert.

DETAILED DESCRIPTION

Figure 1:
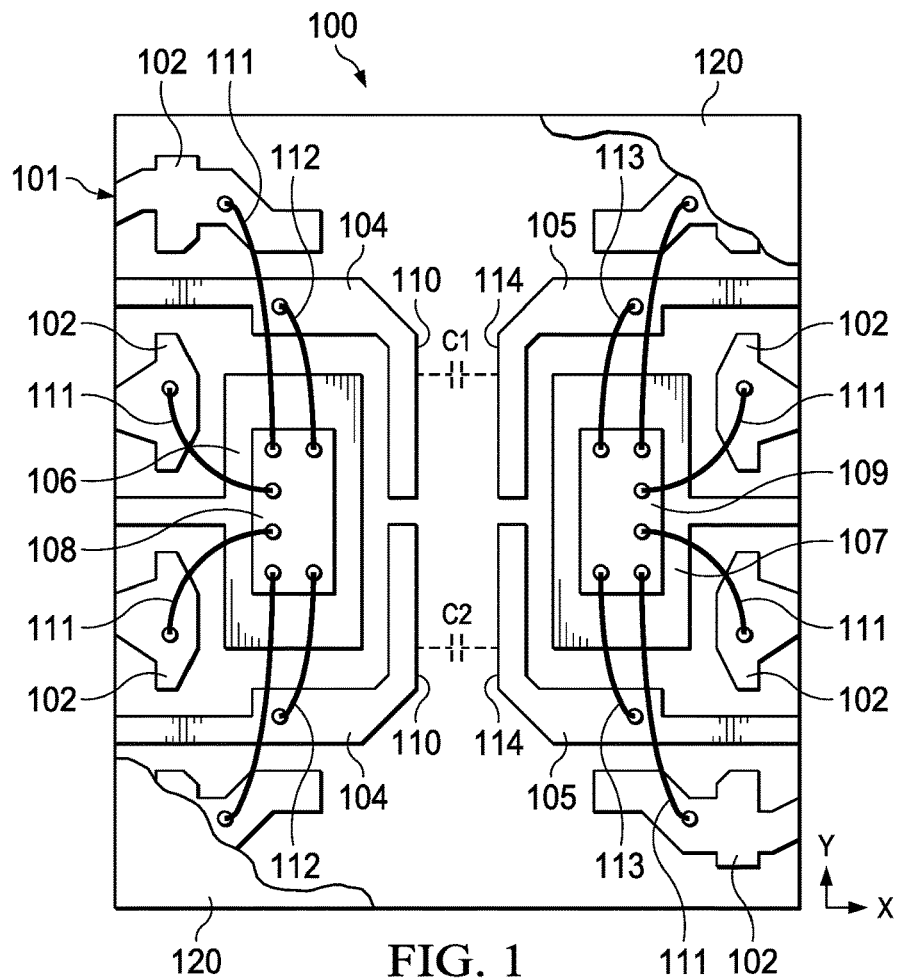
FIG. 1 is a cutaway top plan view of a packaged electronic device with first and second semiconductor dies, and isolation capacitors formed by planar conductive plates from a starting lead frame.

In the drawings, like reference numerals refer to like elements throughout, and the various features are not necessarily drawn to scale. Also, the term "couple" or "couples" includes indirect or direct electrical or mechanical connection or combinations thereof. For example, if a first device couples to or is coupled with a second device, that connection may be through a direct electrical connection, or through an indirect electrical connection via one or more intervening devices and connections. One or more operational characteristics of various circuits, systems and/or components are hereinafter described in the context of functions which in some cases result from configuration and/or interconnection of various structures when circuitry is powered and operating.

FIG. 1 shows a packaged electronic device 100 with conductive features formed from a starting lead frame 101 (e.g., copper, aluminum, etc.), including conductive leads 102, a pair of first conductive plates 104 and a pair of second conductive plates 105. In another example, only a single first conductive plate 104 and a single second conductive plate 105 are included. In other examples, more than two first conductive plates 104 and more than two respective second conductive plates 105 are included. The electronic device further includes a first die attach pad 106 in a second die attach pad 107, which are also originally part of the starting lead frame 101 during manufacturing. The electronic device 100 includes a first die 108 mounted to the first die attach pad 106, and a second die 109 mounted to the second die attach pad 107. The first conductive plates 104 in this example each include a first side 110. The dies 108 and 109 can be any suitable semiconductor-based circuit die, such as formed using semiconductor processing of a starting wafer, including transistors, resistors, capacitors, or other electronic components integrated into a die structure with conductive features (e.g., copper or aluminum bond pads, etc.) allowing bond wire or flip chip electrical connections.

The electronic device 100 further includes electrical connections between the respective first and second dies 108, 109 and various leads and conductive plates. In the illustrated example, bond wires 111 connect conductive features (e.g., bond pads) of the first die 108 to respective ones of a first set of the conductive leads 102 to make electrical circuit connections with a host printed circuit board (PCB, not shown) to which the electronic device 100 is soldered. Other ones of the bond wires 111 connect conductive features of the second die 109 to a second set of the conductive leads 102. In the illustrated example, the first set of conductive leads 102 that are coupled to the first die 108 are on a first lateral side of the electronic device 100 (e.g., the left side in FIG. 1), and the second set of conductive leads 102 that are coupled to the second die 109 are on an opposite second lateral side of the electronic device 100 (e.g., on the right side in FIG. 1), although not a strict requirement of all possible implementations. The electronic device 100 also includes a pair of first bond wires 112, each of which are coupled between conductive features of the first die 108 and a respective one of the first conductive plates 104. In addition, a pair of second bond wires 113 are each coupled between conductive features of the second die 109 and a respective one of the second conductive plates 105.

The second conductive plates 105 in this example each have a second side 114. The first sides 110 of the respective conductive plates 104 in one example extend in a first plane (e.g., a Y-Z plane in FIG. 1, where the Z direction is out of the page in the drawing). In this example, the second sides 114 of the respective second conductive plates 105 extend in a second plane (e.g., also a Y-Z plane), and the first and second planes are parallel to one another. In other examples, the first and second planes are not strictly parallel to one another. In another example, one or both sides 110 and/or 114 is/are not planar. In the illustrated implementation, the second side 114 of each of the second conductive plates 105 is spaced apart from and directly faces the first side 110 of the respective first conductive plate 104. In addition, no other side of the first conductive plates 104 directly faces a side of the respective second conductive plate 105, and no other side of the respective second conductive plates 105 directly faces a side of the respective first conductive plates 104. Directly facing sides, as used herein, are conductive plate sides that face one another along a straight line with no intervening conductive structures. The electronic device 100 further includes a non-conductive package structure 120. In one example, the package structure 120 is or includes molding compound. A portion of the package structure 120 extends between the first sides 110 of the respective first conductive plates 104 and the second sides 114 of the respective second conductive plates 105 to form respective capacitors C1 and C2 as schematically shown in dashed lines in FIG. 1. The intervening package structure 120 between the respective plates sides 110 and 114 provides a dielectric which, in conjunction with the conductive material of the respective plates 104 and 105, forms a capacitor structure that operates to isolate first and second circuits of the first and second dies 108 and 109. In operation of the electronic device 100, the example capacitors C1 and C2 provide galvanic capacitive isolation between first and second voltage domains of the respective first and second dies 108 and 109.

In other implementations, a single isolation capacitor is provided in the electronic device 100 using corresponding first and second plates 104 and 105 with respective first and second sides 110 and 114. In other examples, more than two isolation capacitors are provided by arrangement of corresponding sides 110 and 114 of respective first and second plates 104 and 105, in which the first side 110 of the first conductive plate 104 is spaced apart from and directly faces the second side 114 of the second conductive plate 105, and where no other side of the first conductive plate 104 directly faces a side of the second conductive plate 105 and no other side of the second conductive plate 105 directly faces a side of the first conductive plate 104.

In one example, as shown in FIG. 1, a single starting lead frame 101 is used to create the first and second conductive plates 104 and 105. In this example, the first conductive plate 104 and the second conductive plate 105 are coplanar in a third plane (e.g., an X-Y plane) that is perpendicular to the first and second planes of the respective plate faces 110 and 114, although not a requirement of all possible implementations. In the example of FIG. 1, moreover, the isolation between the respective plates 104 and 105, and between the first and second voltage domains of the respective first and second dies 108 and 109 is provided along a lateral direction. Vertical capacitor plate spacing and isolation directions are provided in other implementations, for example, as illustrated and described below in connection with FIGS. 9-12. In the example of FIG. 1, the package structure 120 has first and second opposite sides along which the respective leads 102 are positioned, where the first and second sides of the package structure 120 are spaced apart from one another along a first direction (e.g., the X direction in FIG. 1), and portions of the conductive leads 102 are exposed outside the package structure 120 along the respective first and second sides of the package structure 120. In one example, the leads are generally flush with the outer sides of the package structure 120 and partially exposed along the bottom and sides, such as for leadless package types including quad flat no lead (QFN) packages or pre-molded package like MIS, RLF etc. In this example, the conductive leads 102 are spaced from one another along a second direction (e.g., the Y direction in FIG. 1) along the respective first and second sides of the package structure 120, where the second direction Y is perpendicular to the first direction X. In the illustrated example, moreover, the second side 114 of the second conductive plate 105 is spaced apart from the first side 110 of the first conductive plate 104 along the first direction X. In other examples, lateral capacitor plate spacing is possible along a different direction in an X-Y plane, such as along the first (Y) direction.

Figure 2:
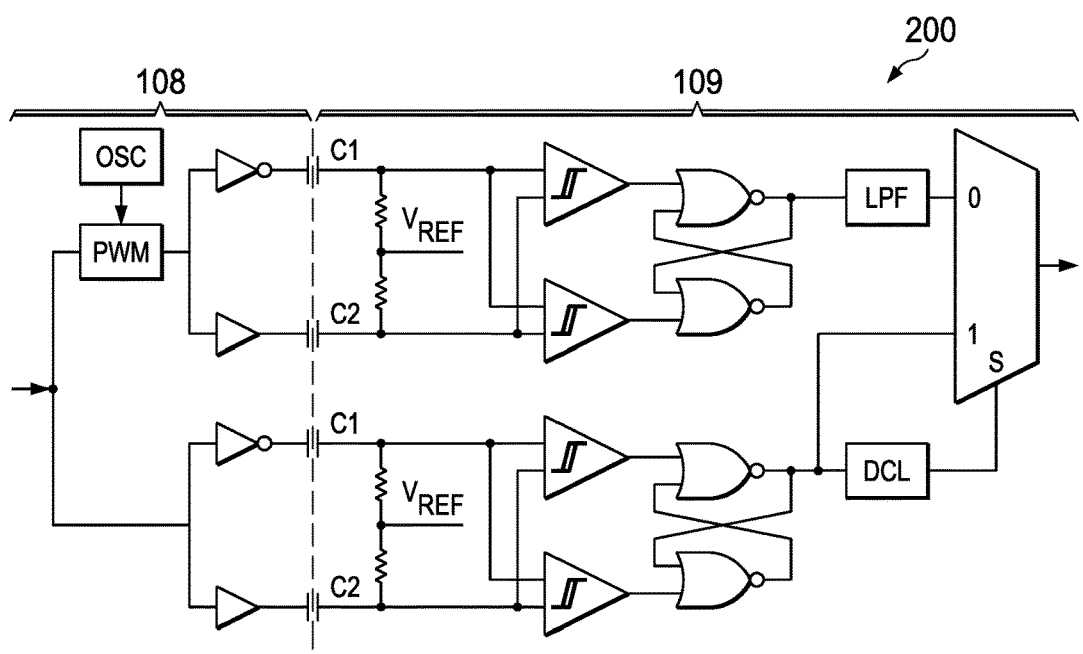
FIG. 2 is a schematic diagram of a circuit implemented in the semiconductor dies and isolation capacitors in the packaged electronic device of FIG. 1.

FIG. 2 shows an isolated communications circuit 200 implemented in the semiconductor dies 108 and 109 and isolation capacitors C1 and C2 in the packaged electronic device 100 of FIG. 1. In certain applications, the capacitors C1 and C2 in FIG. 1 provide a single or multi-channel digital isolator that is created using a custom patterned lead frame 101. In operation, one or more signals are transferred between different voltage domain circuits of the respective first and second dies 108 and 109 using lateral capacitive coupling between lead frame metal areas 104 and 105. The isolated communications circuit 200 includes a high-frequency data channel, for example, with a bandwidth from 100 kbps up to 150 Mbps, as well as a low-frequency channel, for example, with a bandwidth from DC to 100 kbps. In one example implementation, a single-ended input signal entering the high-frequency data channel is split into a differential signal via an inverter gate at the input. The following capacitor-resistor networks differentiate the signal into small and narrow transients, which then are converted into rail-to-rail differential pulses by two comparators. The comparator outputs drive a NOR-gate flip-flop having an output that feeds an output multiplexer. A decision logic (DCL) at the driving output of the flip-flop measures the durations between signal transients. If the duration between two consecutive transients exceeds a certain time limit (e.g., as in the case of a low-frequency signal) the DCL forces the output-multiplexer to switch from the high-frequency to the low-frequency channel. In one example, the low-frequency input signals are pulse width modulated (PWM) with the carrier frequency of an internal oscillator to create a sufficiently high frequency capable of passing the capacitive barrier. As the input is modulated, a low-pass filter (LPF) removes the high-frequency carrier from the actual data before passing it on to the output multiplexer. In this example, the mold compound or any other encapsulant used in forming the package structure 120 acts as an isolation dielectric barrier with designed isolation spacing to provide a robust high dielectric strength barrier across moisture, temperature, and reliability stress conditions. The starting lead frame 101 can be patterned with and desired custom design for mutual capacitance for circuit performance as needed for a given circuit application. The capacitor isolation can be combined with any process fabrication node for functional silicon or other semiconductor processing that is used to create the dies 108 and 109. In this regard, the lead frame 101 can be tailored to a particular isolation application without changing the fabrication processing used in manufacturing the dies 108 and 109, and the semiconductor die fabrication can be simplified and cost effective compared with integrated isolation component solutions. Moreover, the disclosed examples can be manufactured using existing package assembly processes and equipment, thereby providing a compact cost effective isolation solution.

Figure 5:
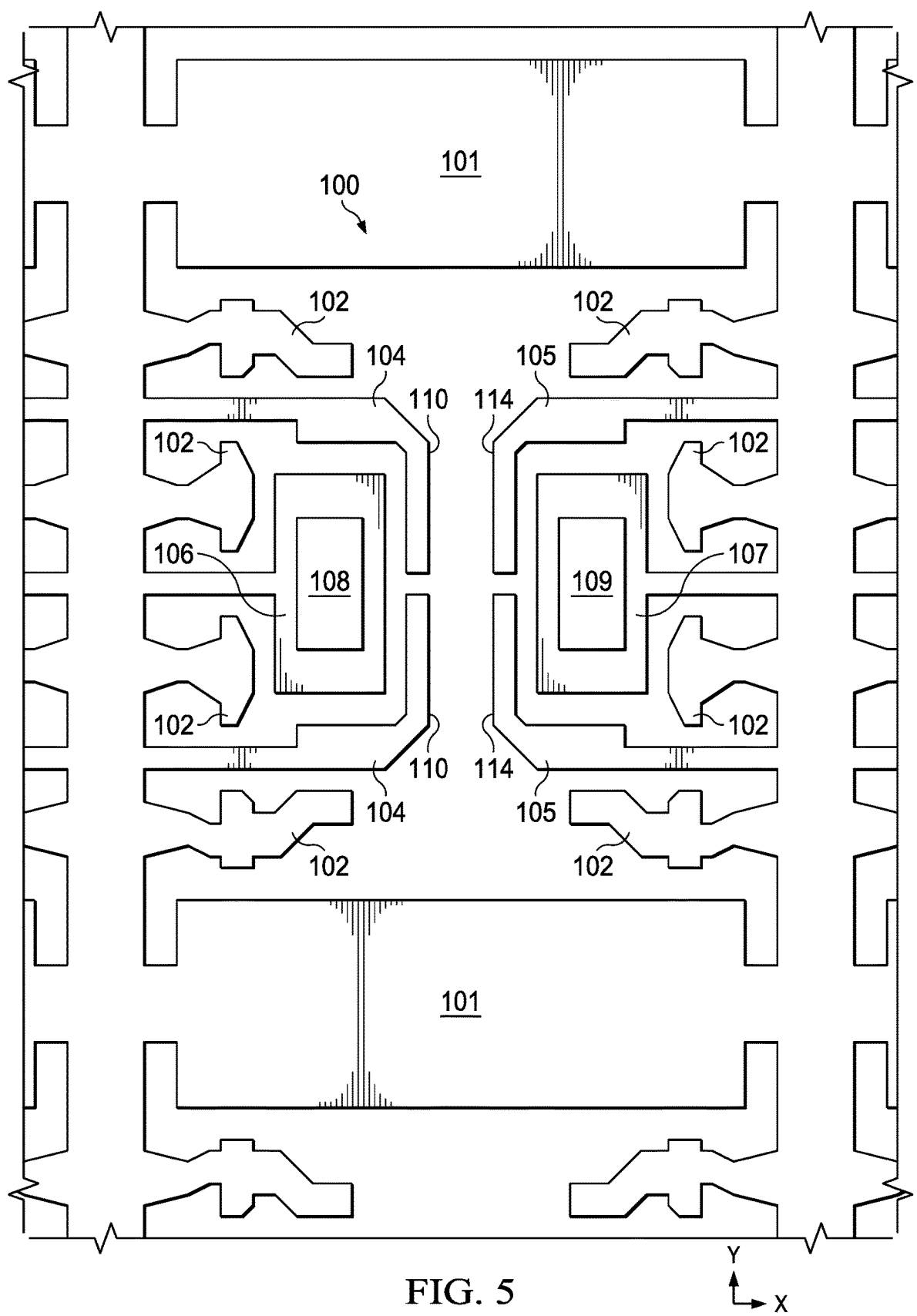
Figure 6:
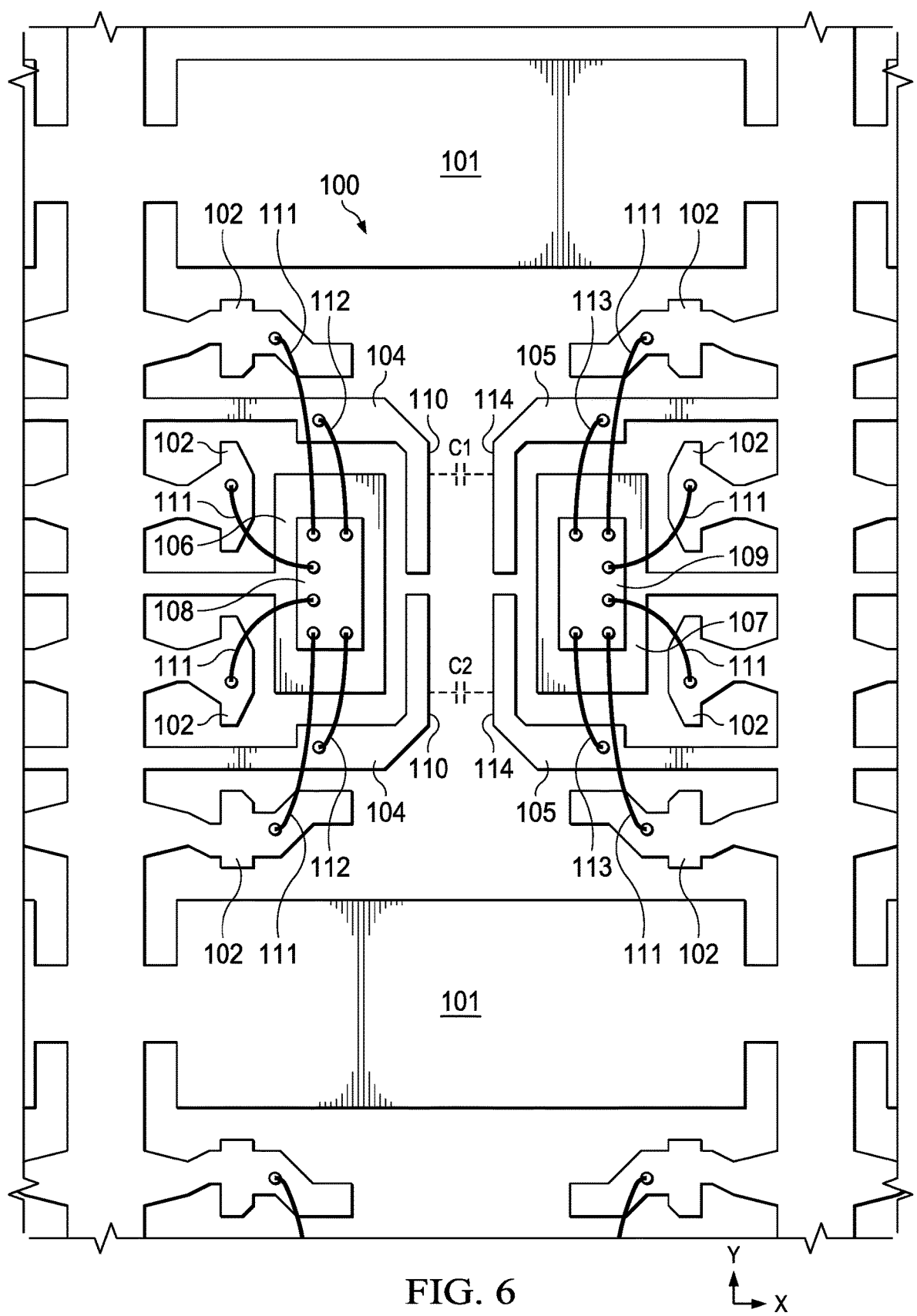

Referring also to FIGS. 3-7, FIG. 3 shows a method 300 of fabricating a packaged electronic device, and FIGS. 4-7 show the packaged electronic device example 100 of FIG. 1 at different stages of fabrication according to the method 300. The method 300 begins at 302 in FIG. 3 with positioning one or more lead frames, for example, the lead frame 101 in FIG. 4, such that the first side 110 of the first conductive plate 104 is spaced apart from and directly faces the second side 114 of the second conductive plate 105, no other side of the first conductive plate 104 directly faces a side of the second conductive plate 105, and no other side of the second conductive plate 105 directly faces a side of the first conductive plate 104. A die attach process is performed at 304, which attaches the first die 108 to the first die attach pad 106, and attaches the second die 109 to the second die attach pad 107, as shown in FIG. 5. The method 300 continues at 306 with performing a connection process. In one example shown in FIG. 6, the connection process is a wire bonding process that electrically connects the first bond wire 112 to the first die 108 and to the first conductive plate 104. The wire bonding process also electrically connects the second bond wire 113 to the second die 109 and to the second conductive plate 105. In the example of FIG. 6, the wire bonding process at 306 interconnects multiple bond wires 111, 112 and 113 between conductive features (e.g., bond pads) of the dies 108 and 109 with the leads 102 and/or the conductive plates 104 and 105 to form electrical circuit that includes the isolation capacitors C1 and C2.

Figure 3:
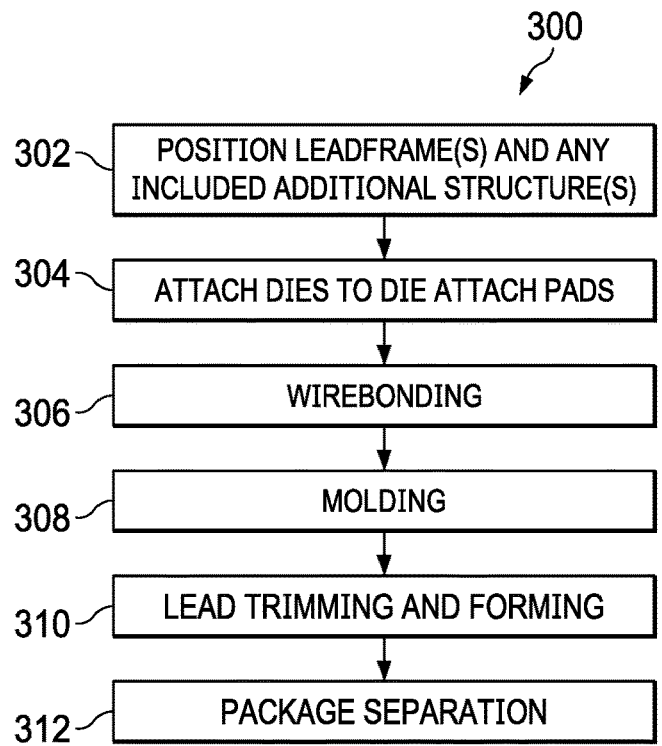
FIG. 3 is a flow diagram of a method of fabricating a packaged electronic device.
Figure 8:
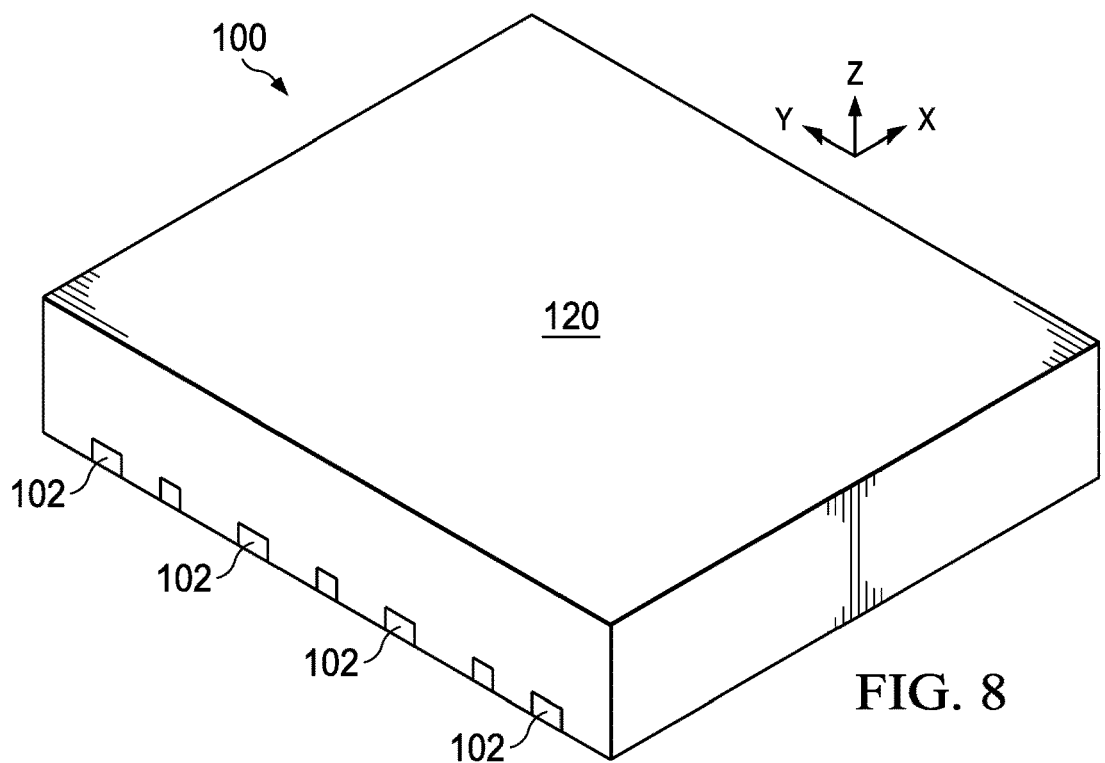
FIG. 8 is a perspective view of the packaged electronic device of FIGS. 1, 2 and 4-7.
Figure 4:
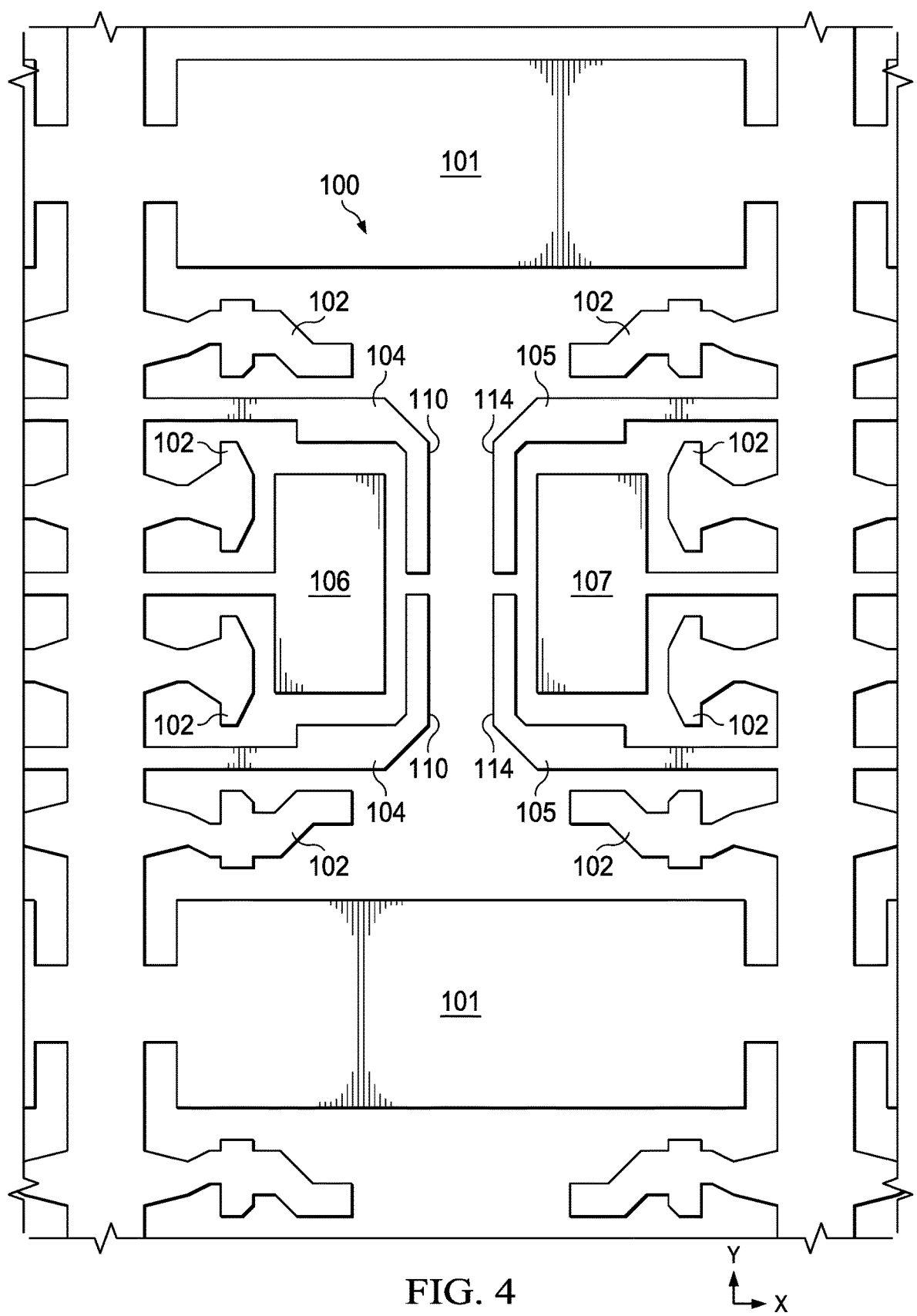
FIGS. 4-7 are partial top plan views of the packaged electronic device of FIG. 1 at different stages of fabrication according to the method of FIG. 3.
Figure 7:
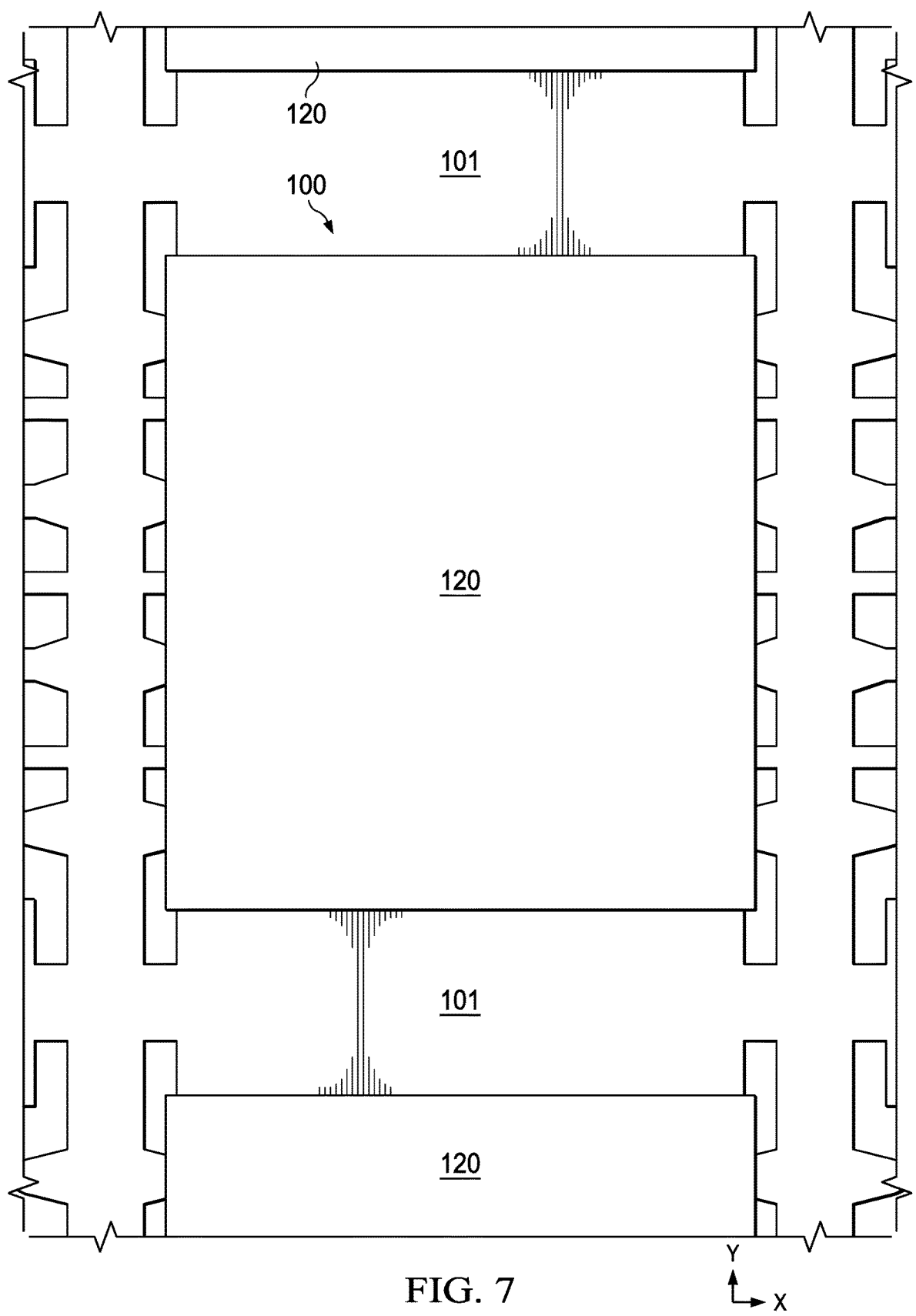

The method 300 continues at 308 in FIG. 3 with a molding process that forms the molded package structure 120. In the example of FIG. 7, the molding process creates separate molded package structures 120 for each prospective electronic device region of the lead frame assembly. The individual package structures 120 in this example each enclose the first die 108, the second die 109, the first bond wire 112, the second bond wire 112, a portion of the first conductive plate 104, and a portion of the second conductive plate 105. Certain examples also include lead trimming and forming operations at 310 in FIG. 3, although not a strict requirement of all possible implementations. At 312, the method 300 further includes separating the first conductive plate 104, the second conductive plate 105, and the conductive leads 102 from a remaining portion of the lead frame 101, for example, using laser cutting or sawing. FIG. 8 shows an example of the separated packaged electronic device 100.

Figure 9:
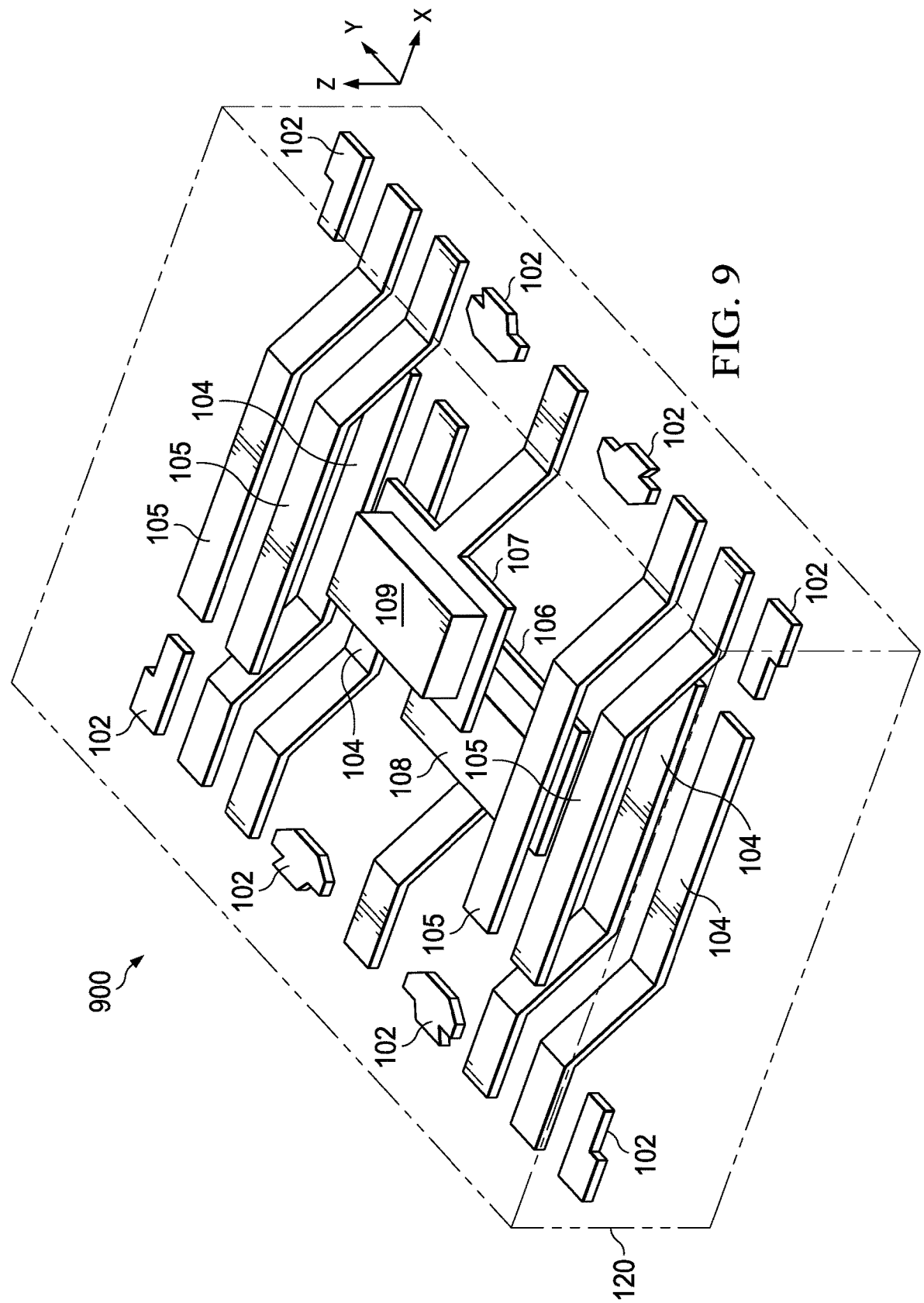
FIG. 9 is a top perspective view of another example packaged electronic device with first and second semiconductor dies and isolation capacitors with vertically spaced conductive plates from first and second starting lead frames.
Figure 10:
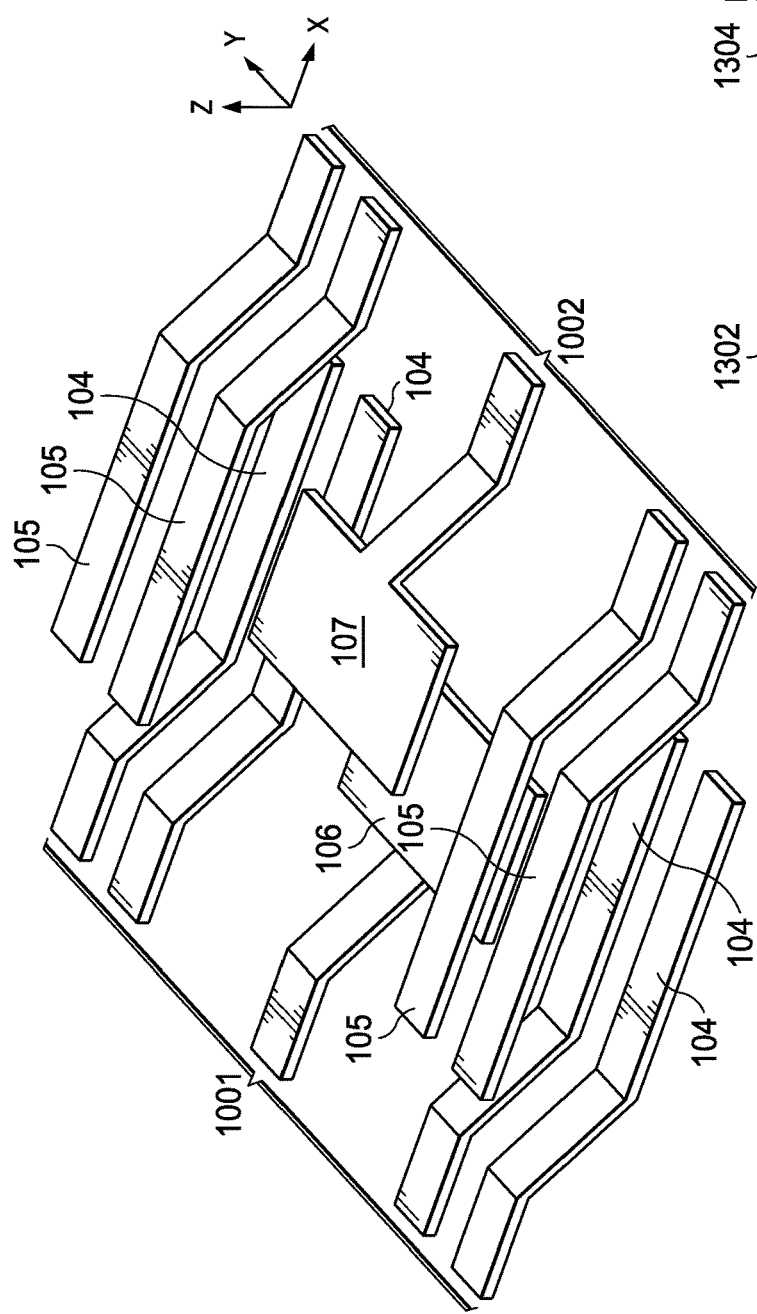
FIG. 10 is a top perspective view of first and second starting lead frames used in fabricating the packaged electronic device of FIG. 9.

Referring also to FIGS. 9 and 10, another example packaged electronic device 900 in FIG. 9 includes lead frame-based isolation capacitors formed through the arrangement and positioning of conductive plates 104 and 105 of respective first and second starting lead frames 1001 and 1002 shown in FIG. 10. This example provides vertical capacitor plate spacing along the Z direction, in which the respective first conductive plates 104 of the first lead frame 1001 have upwardly facing, generally planar first sides, and the corresponding respective second conductive plates 105 of the second lead frame 1002 have downwardly facing, generally planar second sides. The electronic device 900 in this example includes the above-described leads 102, die attach pads 106 and 107, semiconductor dies 108 and 109, and molded package structure 120, as well as bond wires (not shown in FIG. 9) to provide interconnections between the dies 108 and the leads 102 and conductive plates 104 and 105 to form an electrical circuit with two isolated voltage domains and capacitor connections via four capacitors created by the four conductive plates 104 and the four conductive plates 105 respectively separated by the dielectric material of the package structure 120.

As with the electronic device 100 of FIG. 1, the downwardly facing second sides of each of the second conductive plates 105 is spaced apart from and directly faces the upwardly facing first side of the respective first conductive plate 104. In addition, no other side of the first conductive plates 104 directly faces a side of the respective second conductive plate 105, and no other side of the respective second conductive plates 105 directly faces a side of the respective first conductive plates 104. In the example of FIGS. 9 and 10, moreover, the package structure 120 has first and second opposite sides that are spaced apart from one another along the first direction X, and portions of the conductive leads 102 are exposed outside the package structure 120 along the respective first and second sides of the package structure 120. In addition, the conductive leads 102 are spaced from one another along the second direction Y along the respective first and second sides of the package structure 120. In this example, the second sides of the respective second conductive plates 105 are vertically spaced apart from the first sides of the respective first conductive plates 104 along the third direction Z that is perpendicular to the first direction X and to the second direction Y. In other implementations, first and second conductive plates are laterally spaced from one another, such as along the Y direction.

As shown in FIG. 10, the first conductive plates 104 each have a first portion having the first side, and a second portion joint to the first portion by a band, where the first and second portions of the respective first conductive plates 104 are non-coplanar. Similarly, the respective second conductive plates 105 have a first portion that includes the second side, as well as a second portion joint to the first portion by a bend, and the first and second portions of the respective second conductive plates 105 are non-coplanar. During fabrication (e.g., at 302 according to the example method 300 above), the first lead frame 1001 is positioned relative to the second lead frame 1002 as shown in FIG. 10 such that the first sides of the first conductive plates 104 of the first lead frame 1001 are spaced apart from and directly facing the respective second sides of the second conductive plate 105 of the second lead frame 1002, no other side of the first conductive plate 104 directly faces a side of the respective second conductive plate 105, and no other side of the second conductive plate 105 directly faces a side of the first conductive plate 104.

Figure 11:
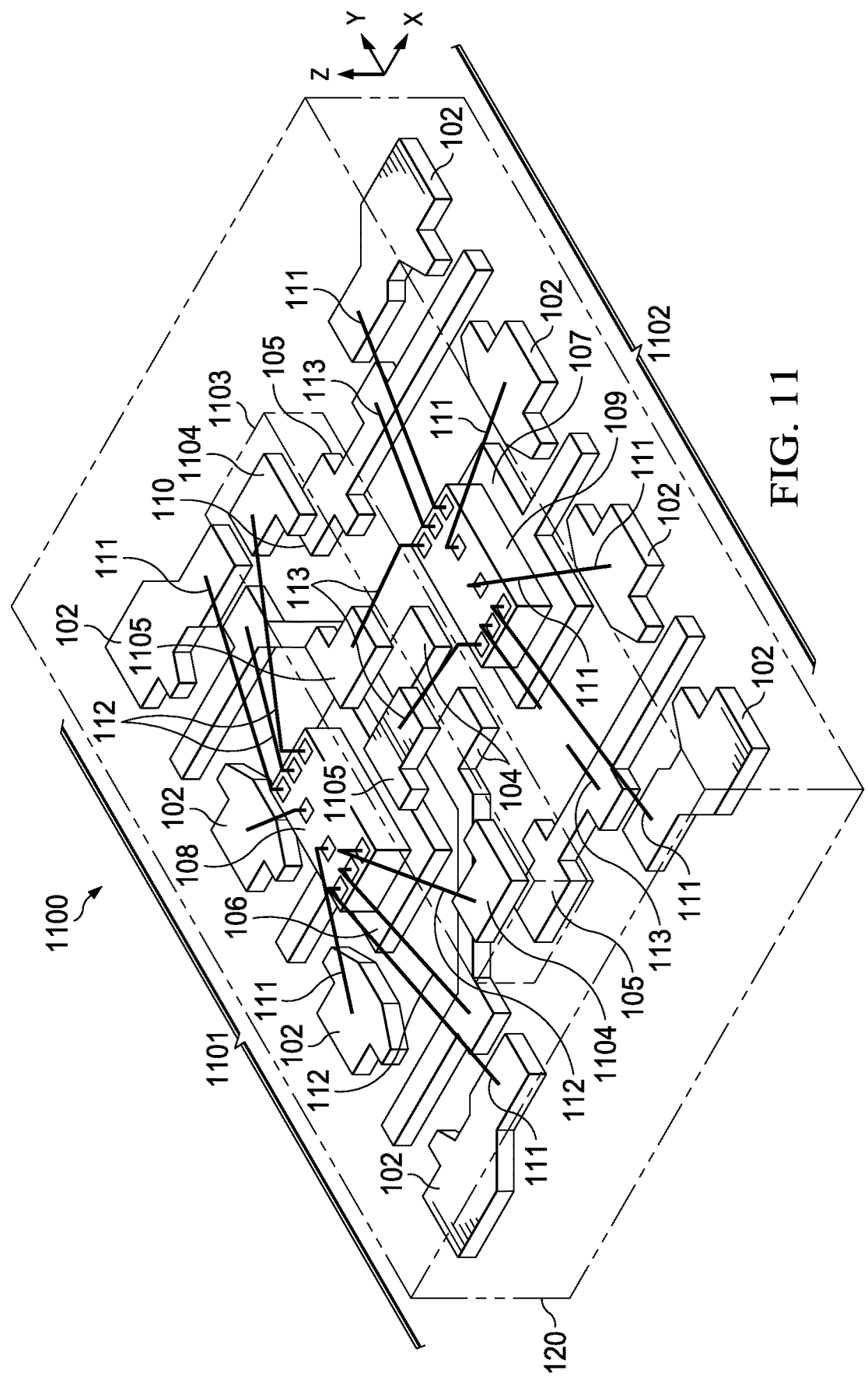
FIG. 11 is a top perspective view of another example packaged electronic device with first and second semiconductor dies and isolation capacitors with vertically spaced conductive plates from first and second starting lead frames and an insert structure with additional conductive capacitor plates.
Figure 12:
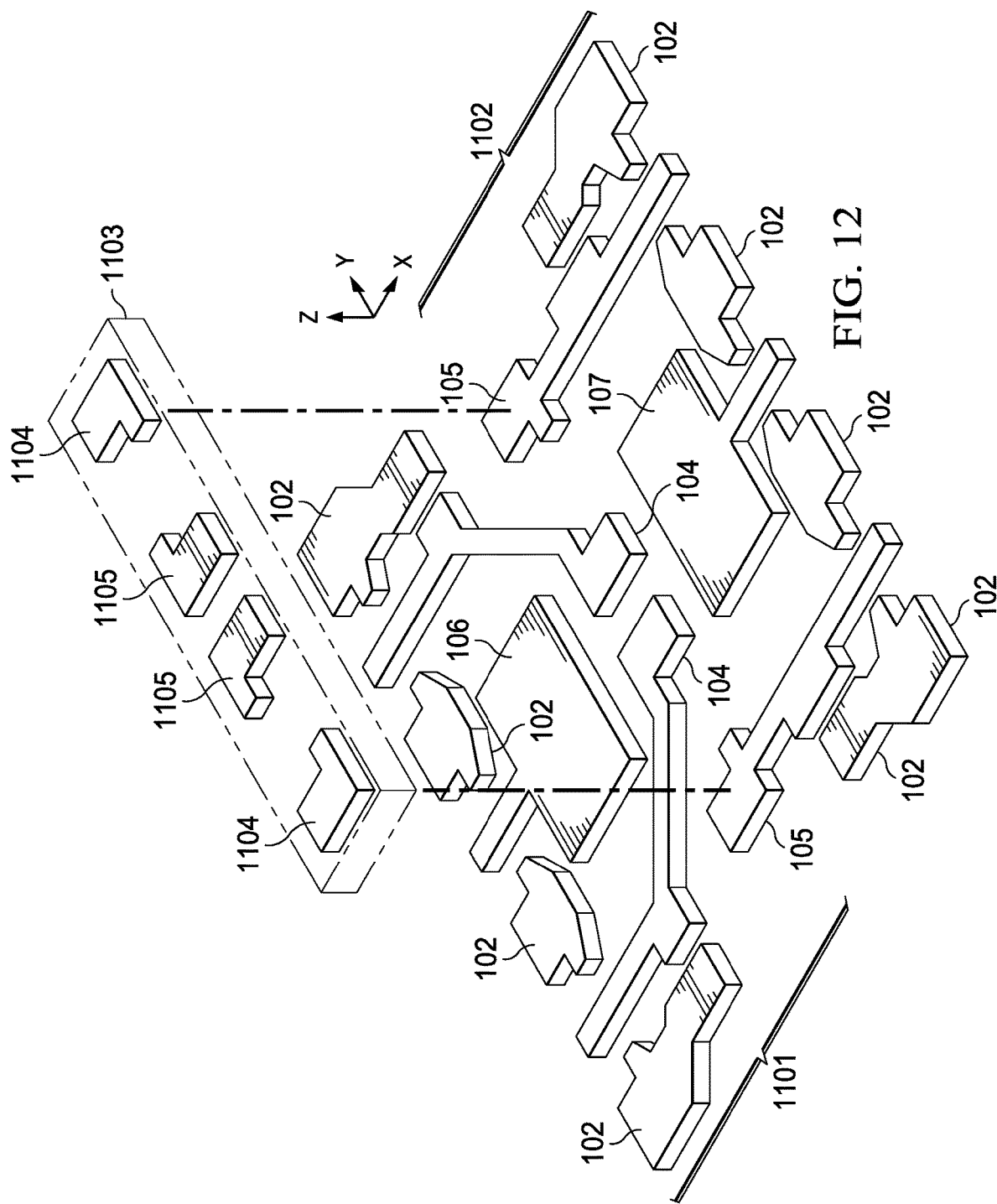
FIG. 12 is a top perspective view of first and second starting lead frames and the insert structure used in fabricating the packaged electronic device of FIG. 11.

Referring also to FIGS. 11 and 12, FIG. 11 shows another example packaged electronic device 1100 with first and second semiconductor dies 108 and 109 and isolation capacitors with vertically spaced conductive plates from first and second starting lead frames 1101 and 1102, as well as a dielectric insert structure 1103 with additional respective first and second conductive capacitor plates 1104 and 1105. FIG. 12 shows the first and second starting lead frames 1101 and 1102 and the insert structure 1103 used in fabricating the packaged electronic device 1100 of FIG. 11. The insert structure 1103 in one example has respective first and second top side conductive plates 1104 and 1105 separated by a dielectric medium. The insert structure 1103, 1104, 1105 can be fabricated by a variety of techniques, including but not limited to dual level laminate construction, pre-molded lead frame (PMLF), MIS, etc. In various implementations, one or more of the first conductive plate 1104 and the second conductive plate 1105 is on or in the embedded dielectric insert 1103.

The electronic device 1100 has the above-described leads 102, die attach pads 106 and 107, semiconductor dies 108 and 109, and molded package structure 120, as well as bond wires 111, 112 and 113 to provide interconnections between the dies 108 and the leads 102 and conductive plates 104, 1104, 105 and 1105 to form an electrical circuit with two isolated voltage domains and capacitor connections via four capacitors created by the four conductive plates 104 and the four conductive plates 105 and the associated conductive plates 1104 and 1105 of the insert structure 1103, respectively separated by the dielectric material of the package structure 120. In this example, the package structure 120 has first and second opposite sides spaced apart from one another along the first direction X, and portions of the conductive leads 102 are exposed outside the package structure 120 along the respective first and second package structure sides. The conductive leads 102 in this example are spaced from one another along the second direction Y, and the second sides of the respective second conductive plates 105, 1105 are spaced apart from the first sides of the respective first conductive plates 104, 1104 along the third direction Z. This example also provides vertical capacitor plate spacing, although not a strict requirement of all possible implementations that use an insert structure.

During fabrication (e.g., at 302 according to the example method 300 above), the first lead frame 1101, the second lead frame 1102, and the dielectric insert structure 1103 are positioned relative to one another such that the first sides of the first conductive plates 104 of the first lead frame 1001 are spaced apart from and directly facing the respective second sides of the second conductive plates 1105 of the dielectric insert 1103, no other side of the first conductive plate 104 directly faces a side of the second conductive plate 1105, and no other side of the second conductive plate 1105 directly faces a side of the first conductive plate 104. The relative positioning at 302 in this example also provides that the first side of a third conductive plate 105 of the second lead frame 1102 is spaced apart from and directly faces a second side of a fourth conductive plate 1104 of the dielectric insert 1103, no other side of the third conductive plate 105 directly faces a side of the fourth conductive plate 1104, and no other side of the fourth conductive plate 1104 directly faces a side of the third conductive plate 105.

Figure 13:
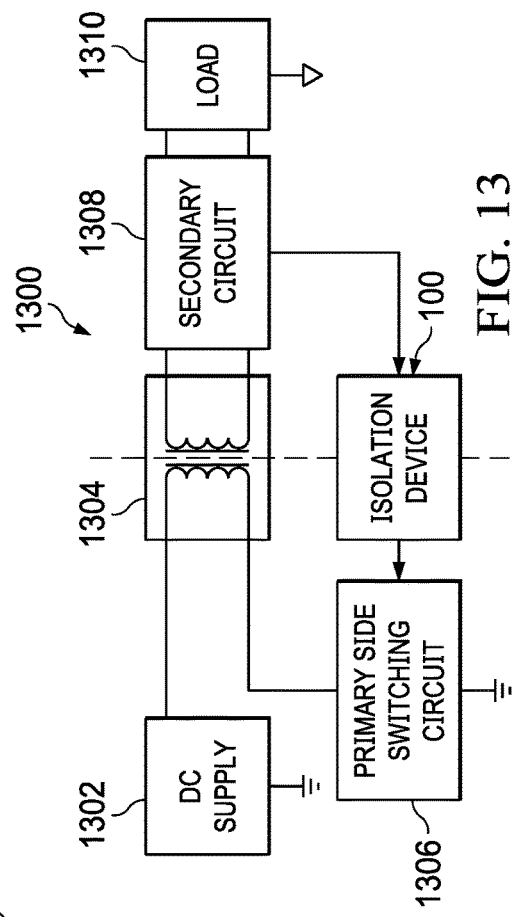
FIG. 13 is a schematic diagram of a power conversion system with isolated primary and secondary circuits and a control or feedback signal path including the packaged electronic device of FIG. 1.

FIG. 13 shows a power conversion system 1300 with isolated primary and secondary circuits and a control or feedback signal path including the packaged electronic device 100 of FIG. 1. This example includes a DC supply 1302 with an output coupled to a first end of a primary winding of an isolation transformer 1304. A second end of the primary winding is coupled to a primary site switching circuit 1306. A secondary winding of the transformer 1304 is coupled to a secondary circuit 1308, for example, to implement a flyback switching power conversion system 1300. The secondary circuit 1308 is coupled to provide regulated output power to drive a load 1310. The electronic device 100 in this example is an isolation device that provides a feedback signal or a switching control signal from the secondary circuit 1308 two the primary side switching circuit 1306. In one example, the secondary circuit 1308 provides a signal to the isolation device 100 relative to an output or load side voltage domain, for example, representing a zero crossing of the switching circuit coupled to the secondary winding of the transformer 1304. In this example, the isolation device 100 provides an isolated signal to the primary site switching circuit 1306, and in response, the primary site switching circuit initiates a new switching cycle to close a switch to cause current flow in the primary winding of the transformer 1304. In another example, the secondary circuit 1308 provides a feedback signal to the isolation device 100 that represents an output voltage or output current of the load 1310, and the primary site switching circuit 1306 regulates the output voltage or current in closed-loop fashion according to the feedback signal from the isolation device 100.

The described examples provide a global low cost solution for signal isolation, with applicability across package types and footprints. These examples, moreover, can be used to provide high voltage isolation in a single package electronic device 100, 900, 1100 without requiring integration of capacitor isolation components on or in the semiconductor dies 108 and 109, thereby reducing the cost and complexity of the die fabrication. In addition, the described electronic devices 100, 900, 1100 provide integration within the packaged electronic device itself, thereby mitigating or avoiding the extra cost and board space associated with using optocouplers or other external isolation components. The described examples provide signal isolation using lead frame metal structures for a solution that is silicon fabrication process agnostic. The resulting solutions, moreover, have much lower cost than integration of isolation components in a silicon fabrication process. The electronic devices 100, 900, and 1100, moreover, can be fabricated using existing lead frame manufacturing and assembly infrastructure and processes, allowing adaptation to a variety of different designs and use applications. These isolation solutions can be extended to all lead frame and/or laminate-based package types and form factors, while providing a robust isolation barrier. The described examples provide a technical solution to the previous problems of high cost, long cycle time and isolation technology based development limitations because of separate design, qualification, and certification requirements for each process node by removing isolation component dependency from silicon fabrication process nodes, and integrating the isolation solution into the lead frame itself.

Modifications are possible in the described examples, and other implementations are possible, within the scope of the claims.

What is claimed is:

1. A method, comprising:
    positioning a lead frame such that: a first side of a first conductive plate is spaced apart from and directly facing a second side of a second conductive plate; no other side of the first conductive plate directly faces a side of the second conductive plate; and no other side of the second conductive plate directly faces a side of the first conductive plate;
    performing a connection process that electrically connects a first bond wire to a first die and to the first conductive plate, and electrically connects a second bond wire to a second die and to the second conductive plate;
    performing a molding process that forms a package structure which encloses: the first die; the second die; the first bond wire; the second bond wire; a portion of the first conductive plate; and a portion of the second conductive plate; and
    separating the first conductive plate, the second conductive plate, and conductive leads from a remaining portion of the lead frame.

2. The method of claim 1, wherein positioning the lead frame comprises:
    positioning a first lead frame relative to a second lead frame or relative to a dielectric insert such that: the first side of the first conductive plate of the first lead frame is spaced apart from and directly facing the second side of the second conductive plate of the second lead frame or of the dielectric insert; no other side of the first conductive plate directly faces a side of the second conductive plate; and no other side of the second conductive plate directly faces a side of the first conductive plate.

3. The method of claim 2, wherein positioning the lead frame comprises:

positioning the first lead frame relative to the dielectric insert such that: the first side of the first conductive plate of the first lead frame is spaced apart from and directly facing the second side of the second conductive plate of the dielectric insert; no other side of the first conductive plate directly faces a side of the second conductive plate; and no other side of the second conductive plate directly faces a side of the first conductive plate; and positioning the second lead frame relative to the dielectric insert such that: a first side of a third conductive plate of the second lead frame is spaced apart from and directly facing a second side of a fourth conductive plate of the dielectric insert; no other side of the third conductive plate directly faces a side of the fourth conductive plate; and no other side of the fourth conductive plate directly faces a side of the third conductive plate.

4. The method of claim 1, wherein positioning the lead frame comprises:

positioning a first lead frame relative to a dielectric insert such that: the first side of the first conductive plate of the first lead frame is spaced apart from and directly facing the second side of a second conductive plate of the dielectric insert; no other side of the first conductive plate directly faces a side of the second conductive plate; and no other side of the second conductive plate directly faces a side of the first conductive plate; and positioning a second lead frame relative to the dielectric insert such that: a first side of a third conductive plate of the second lead frame is spaced apart from and directly facing a second side of a fourth conductive plate of the dielectric insert; no other side of the third conductive plate directly faces a side of the fourth conductive plate; and no other side of the fourth conductive plate directly faces a side of the third conductive plate.

5. A method of making an electronic device, comprising:
providing a package structure with conductive leads partially exposed outside the package structure;
mounting a first die to a first die attach pad in the package structure, a first conductive plate in the package structure, the first conductive plate having a first side and a second conductive plate in the package structure, the second conductive plate having a second side;
mounting a second die to a second die attach pad in the package structure;
coupling a first bond wire to the first die and to the first conductive plate in the package structure;
coupling a second bond wire to the second die and to the second conductive plate in the package structure; and
the second side of the second conductive plate being spaced apart from and directly facing the first side of the first conductive plate, a portion of the package structure extending between the first side of the first conductive plate and the second side of the second conductive plate to form a capacitor, no other side of the first conductive plate directly facing a side of the second conductive plate, and no other side of the second conductive plate directly facing a side of the first conductive plate.

6. The method of claim 5, wherein: the first side of the first conductive plate extends in a first plane; the second side of the second conductive plate extends in a second plane; and the first and second planes are parallel to one another.

7. The method of claim 6, wherein the first conductive plate and the second conductive plate are coplanar in a third plane that is perpendicular to the first and second planes.

8. The method of claim 6, wherein: the package structure has first and second opposite sides; the first and second sides of the package structure are spaced apart from one another along a first direction; portions of the conductive leads are exposed outside the package structure along the respective first and second sides of the package structure; the conductive leads are spaced from one another along a second direction along the respective first and second sides of the package structure; the second direction is perpendicular to the first direction; and the second side of the second conductive plate is spaced apart from the first side of the first conductive plate along one of the first and second directions.

9. The method of claim 5, wherein: the package structure has first and second opposite sides; the first and second sides of the package structure are spaced apart from one another along a first direction; portions of the conductive leads are exposed outside the package structure along the respective first and second sides of the package structure; the conductive leads are spaced from one another along a second direction along the respective first and second sides of the package structure; the second direction is perpendicular to the first direction; and the second side of the second conductive plate is spaced apart from the first side of the first conductive plate along a third direction that is perpendicular to the first direction and to the second direction.

10. The method of claim 9, wherein: the first conductive plate has a first portion having the first side, and a second portion; and the first and second portions of the first conductive plate are non-coplanar.

11. The method of claim 10, wherein: the second conductive plate has a first portion having the second side, and a second portion; and the first and second portions of the second conductive plate are non-coplanar.

12. The method of claim 10, wherein: the first side of the first conductive plate extends in a first plane; the second side of the second conductive plate extends in a second plane; and the first and second planes are parallel to one another.

13. The method of claim 9, further comprising an embedded dielectric insert in the package structure, wherein one of the first conductive plate and the second conductive plate is on or in the embedded dielectric insert.

14. The method of claim 13, further comprising multiple conductive plates on or in the embedded dielectric insert.

15. The method of claim 13, wherein: the first side of the first conductive plate extends in a first plane; the second side of the second conductive plate extends in a second plane; and the first and second planes are parallel to one another.

16. The method of claim 14, wherein: the first side of the first conductive plate extends in a first plane; the second side of the second conductive plate extends in a second plane; and the first and second planes are parallel to one another.

17. A method, comprising:
providing a first electronic circuit of a first voltage domain;
providing a second electronic circuit of a second voltage domain; and
coupling an isolation device with the first and second electronic circuits, the isolation device comprising:
a package structure;
a first set of conductive leads partially exposed outside the package structure and coupled to the first electronic circuit;

a second set of conductive leads partially exposed outside the package structure and coupled to the second electronic circuit;

a first die mounted to a first die attach pad in the package structure and coupled to the first set of conductive leads;

a second die mounted to a second die attach pad in the package structure and coupled to the second set of conductive leads;

a first conductive plate in the package structure, the first conductive plate having a first side;

a second conductive plate in the package structure, the second conductive plate having a second side;

a first bond wire coupled to the first die and to the first conductive plate in the package structure;

a second bond wire coupled to the second die and to the second conductive plate in the package structure; and the second side of the second conductive plate being spaced apart from and directly facing the first side of the first conductive plate, a portion of the package structure extending between the first side of the first conductive plate and the second side of the second conductive plate to form a capacitor, no other side of the first conductive plate directly facing a side of the second conductive plate, and no other side of the second conductive plate directly facing a side of the first conductive plate.

18. The method of claim 17, wherein: the first side of the first conductive plate extends in a first plane; the second side of the second conductive plate extends in a second plane; the first and second planes are parallel to one another; and the first conductive plate and the second conductive plate are coplanar in a third plane that is perpendicular to the first and second planes.

19. The method of claim 17, wherein: the first conductive plate has a first portion having the first side, and a second portion; and the first and second portions of the first conductive plate are non-coplanar.

20. The method of claim 17, wherein the isolation device further comprises an embedded dielectric insert in the package structure, wherein one of the first conductive plate and the second conductive plate is on or in the embedded dielectric insert.

21. A method, comprising:

spacing a first side of a first conductive plate of a lead frame apart from and directly facing a second side of a second conductive plate of the lead frame, no other side of the first conductive plate directly faces a side of the second conductive plate and no other side of the second conductive plate directly faces a side of the first conductive plate;

coupling a first die to the first conductive plate with a first bond wire;

coupling a second die to the second conductive plate with a second bond wire;

enclosing the first die, the second die, the first bond wire, the second bond wire, a portion of the first conductive plate and a portion of the second conductive plate with a package structure; and the first conductive plate, the second conductive plate, and conductive leads separated from a remaining portion of the lead frame.

22. The method of claim 21, wherein:

the side of the first conductive plate of the lead frame is spaced apart from and directly faces the second side of the second conductive plate of the lead frame or the dielectric insert;

no other side of the first conductive plate directly faces a side of the second conductive plate; and no other side of the second conductive plate directly faces a side of the first conductive plate.

23. The method of claim 22, wherein:

the first conductive plate of the lead frame is spaced apart from and directly faces the second side of the second conductive plate of the dielectric insert;

no other side of the first conductive plate directly faces a side of the second conductive plate;

no other side of the second conductive plate directly faces a side of the first conductive plate;

a first side of a third conductive plate of the second lead frame is spaced apart from and directly facing a second side of a fourth conductive plate of the dielectric insert;

no other side of the third conductive plate directly faces a side of the fourth conductive plate; and no other side of the fourth conductive plate directly faces a side of the third conductive plate.

24. The method of claim 21, wherein:

the first side of the first conductive plate of the lead frame is spaced apart from and directly faces the second side of a second conductive plate of the dielectric insert;

no other side of the first conductive plate directly faces a side of the second conductive plate;

no other side of the second conductive plate directly faces a side of the first conductive plate;

a first side of a third conductive plate of the second lead frame is spaced apart from and directly facing a second side of a fourth conductive plate of the dielectric insert;

no other side of the third conductive plate directly faces a side of the fourth conductive plate; and no other side of the fourth conductive plate directly faces a side of the third conductive plate.

* * * * *